US011522126B2

(12) United States Patent
Xue et al.

(10) Patent No.: US 11,522,126 B2
(45) Date of Patent: Dec. 6, 2022

(54) MAGNETIC TUNNEL JUNCTIONS WITH PROTECTION LAYERS

(71) Applicant: Applied Materials, Inc., Santa Clara, CA (US)

(72) Inventors: Lin Xue, San Diego, CA (US); Jaesoo Ahn, San Jose, CA (US); Sahil Patel, Sunnyvale, CA (US); Chando Park, Palo Alto, CA (US); Mahendra Pakala, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/601,250

(22) Filed: Oct. 14, 2019

(65) Prior Publication Data
US 2021/0111338 A1 Apr. 15, 2021

(51) Int. Cl.
*H01L 43/12* (2006.01)
*H01L 43/08* (2006.01)
(Continued)

(52) U.S. Cl.
CPC ............ *H01L 43/12* (2013.01); *G11B 5/3909* (2013.01); *G11C 11/161* (2013.01);
(Continued)

(58) Field of Classification Search
None
See application file for complete search history.

(56) References Cited

U.S. PATENT DOCUMENTS 6,775,110 B1 * 8/2004 Hayashi ................. B82Y 10/00
360/324.1
6,960,480 B1 * 11/2005 Horng .................... B82Y 25/00
257/E43.004

(Continued)

FOREIGN PATENT DOCUMENTS

JP 2009152333 A 7/2009
JP 2009194398 A 8/2009
(Continued)

OTHER PUBLICATIONS

Tsunekawa et al., "Giant tunneling magnetoresistive effect in low-resistance CoFeB/MgO(001)/CoFeB magnetic tunnel junctions for read-head applications," Appl. Phys. Lett. 87, 072503 (2005); https://doi.org/10.1063/1.2012525, published online: Aug. 8, 2005 (Year: 2005).*

(Continued)

*Primary Examiner* — William J Klimowicz
(74) *Attorney, Agent, or Firm* — Patterson + Sheridan, LLP

(57) ABSTRACT

A film stack for a magnetic tunnel comprises a substrate, a magnetic reference layer disposed over the substrate, and a tunnel barrier layer disposed over the magnetic reference layer. The film stack further comprises a magnetic storage layer disposed over the tunnel barrier layer, and a capping layer disposed over the magnetic storage layer. Further, the film stack comprises at least one protection layer disposed between the magnetic reference layer and the tunnel barrier layer and disposed between the magnetic storage layer and the capping layer. Additionally, a material forming the at least one protection layer differs from at least one of a material forming the magnetic reference layer and a material forming the magnetic storage layer.

18 Claims, 7 Drawing Sheets

(51) Int. Cl.
*G11C 11/16* (2006.01)
*G11B 5/39* (2006.01)
*H01L 43/10* (2006.01)
*H01L 27/22* (2006.01)
*H01L 43/02* (2006.01)

(52) U.S. Cl.
CPC ............ *H01L 27/222* (2013.01); *H01L 43/02* (2013.01); *H01L 43/08* (2013.01); *H01L 43/10* (2013.01)

(56) References Cited

U.S. PATENT DOCUMENTS

| | | | |
|---|---|---|---|
| 7,098,495 B2 | 8/2006 | Sun et al. | |
| 7,598,579 B2 | 10/2009 | Horng et al. | |
| 7,760,474 B1* | 7/2010 | Huai | B82Y 10/00 360/324.12 |
| 7,933,100 B2* | 4/2011 | Nakabayashi | B82Y 10/00 360/324.2 |
| 8,120,126 B2* | 2/2012 | Lee | H01F 10/329 257/421 |
| 8,878,318 B2* | 11/2014 | Chen | G11C 11/161 257/421 |
| 8,987,006 B2* | 3/2015 | Moon | H01L 43/08 257/295 |
| 9,177,575 B1* | 11/2015 | Gao | G11B 5/3909 |
| 9,299,923 B2 | 3/2016 | Oh et al. | |
| 9,331,271 B2* | 5/2016 | Horng | C23C 14/3414 |
| 9,972,773 B1* | 5/2018 | Lee | H01L 43/08 |
| 10,141,499 B1* | 11/2018 | Schabes | H01F 10/3272 |
| 10,236,439 B1* | 3/2019 | Schabes | H01F 41/307 |
| 10,255,935 B2 | 4/2019 | Xue et al. | |
| 10,339,993 B1* | 7/2019 | Schabes | H01L 43/12 |
| 10,374,147 B2* | 8/2019 | Pinarbasi | H01F 10/3254 |
| 10,431,734 B2* | 10/2019 | Park | G11C 11/161 |
| 10,522,745 B2* | 12/2019 | Patel | H01L 43/08 |
| 10,553,642 B2* | 2/2020 | Lee | G11C 11/161 |
| 10,622,011 B2 | 4/2020 | Xue et al. | |
| 10,636,964 B2 | 4/2020 | Xue et al. | |
| 2005/0219769 A1* | 10/2005 | Shimura | B82Y 25/00 360/324.2 |
| 2006/0018057 A1 | 1/2006 | Huai | |
| 2007/0111332 A1* | 5/2007 | Zhao | G01R 33/098 438/3 |
| 2008/0186639 A1* | 8/2008 | Nishimura | G01R 33/098 360/324.2 |
| 2009/0296286 A1* | 12/2009 | Lin | B82Y 25/00 360/324.2 |
| 2010/0219491 A1 | 9/2010 | Lee et al. | |
| 2010/0304185 A1 | 12/2010 | Zhao et al. | |
| 2012/0205758 A1* | 8/2012 | Jan | B82Y 40/00 257/421 |
| 2012/0267736 A1* | 10/2012 | Moon | H01L 27/224 257/421 |
| 2012/0280336 A1* | 11/2012 | Jan | H01L 43/12 257/421 |
| 2013/0216702 A1 | 8/2013 | Kaiser et al. | |
| 2013/0249025 A1* | 9/2013 | Natori | H01L 43/12 257/421 |
| 2014/0021426 A1 | 1/2014 | Lee et al. | |
| 2014/0151827 A1* | 6/2014 | Zhou | H01F 41/307 257/421 |
| 2014/0248719 A1 | 9/2014 | Zhou et al. | |
| 2015/0171315 A1* | 6/2015 | Gan | H01F 10/3286 257/421 |
| 2015/0255507 A1 | 9/2015 | Pakala et al. | |
| 2015/0325783 A1* | 11/2015 | Wang | H01L 43/10 257/421 |
| 2016/0155931 A1* | 6/2016 | Lee | H01L 43/08 257/421 |
| 2016/0240772 A1* | 8/2016 | Seino | H01L 21/68742 |
| 2016/0351799 A1 | 12/2016 | Xue et al. | |
| 2017/0018706 A1 | 1/2017 | Xue et al. | |
| 2017/0084826 A1* | 3/2017 | Zhou | H01F 41/302 |
| 2019/0027169 A1* | 1/2019 | Xue | G11C 11/15 |
| 2019/0066747 A1* | 2/2019 | Lee | H01L 27/226 |
| 2019/0207092 A1* | 7/2019 | Pinarbasi | H01F 10/3254 |
| 2019/0207096 A1* | 7/2019 | Pinarbasi | G11C 11/1675 |
| 2019/0305217 A1* | 10/2019 | Xue | H01L 27/222 |
| 2019/0392879 A1* | 12/2019 | Vasquez | G11C 11/161 |
| 2020/0270737 A1* | 8/2020 | Patel | C23C 14/165 |

FOREIGN PATENT DOCUMENTS

| | | | | |
|---|---|---|---|---|
| JP | 5138204 B2 * | 2/2013 | ............ | B82Y 40/00 |
| JP | 2013197409 A * | 9/2013 | ............ | H01L 43/08 |
| KR | 101537715 B1 | 7/2015 | | |
| KR | 20160010139 A | 1/2016 | | |
| KR | 101652006 B1 | 8/2016 | | |
| KR | 20160145622 A | 12/2016 | | |
| WO | WO-2014109978 A1 * | 7/2014 | ............ | H01L 43/12 |
| WO | WO-2015175027 A1 * | 11/2015 | ............ | H01L 43/08 |
| WO | 20170134697 A1 | 8/2017 | | |

OTHER PUBLICATIONS

U.S. Patent Application entitled "Magnetic Tunnel Junctions and Methods of Fabrication Thereof," U.S. Appl. No. 16/029,844, filed Jul. 9, 2018.
International Search Report and Written Opinion from PCT/US2020/045782 dated Dec. 4, 2020.

* cited by examiner

US 11,522,126 B2

MAGNETIC TUNNEL JUNCTIONS WITH PROTECTION LAYERS

BACKGROUND

Field

Embodiments of the present disclosure generally relate to magnetic tunnel junction structures.

Description of the Related Art

Magnetic tunnel junction (MTJ) structures may be employed in memory cells. MTJ structures commonly include two ferro-magnetic layers spaced from one another by an insulating or "dielectric" layer. Changing the magnetic moment polarity of one of the ferro-magnetic layers with reference to the other ferro-magnetic layer alters the electric resistance across the MTJ. Where the polarity of each of the two layers is the same, the electric resistance across the MTJ is low, and when the polarity of each of the two layers are opposite to one another, the electric resistance across the MTJ is high. Thus, the electrical resistance across can be used to indicate a value of 0 or 1, and thus store a data value. For example by using the low resistance state as having the data value of 0, and the high resistance state as the data value of 1.

To form an MTJ stack, a film layer stack is fabricated that includes a first ferro-magnetic layer (e.g., a magnetic reference layer) is separated from a second ferro-magnetic layer (e.g., a magnetic storage layer) by a tunnel barrier layer. A capping layer is deposited over the magnetic storage layer. However, during deposition of the tunnel barrier layer and/or the capping, one or more of the ferro-magnetic layers may be oxidized. The oxidation alters the electrical resistance and magnetic properties that may be formed within the MTJ stack and may cause a corresponding memory cell to fail.

Thus, there remains a need for an improved MTJ having reduced oxidization formed during the deposition process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

SUMMARY

Figure 1:
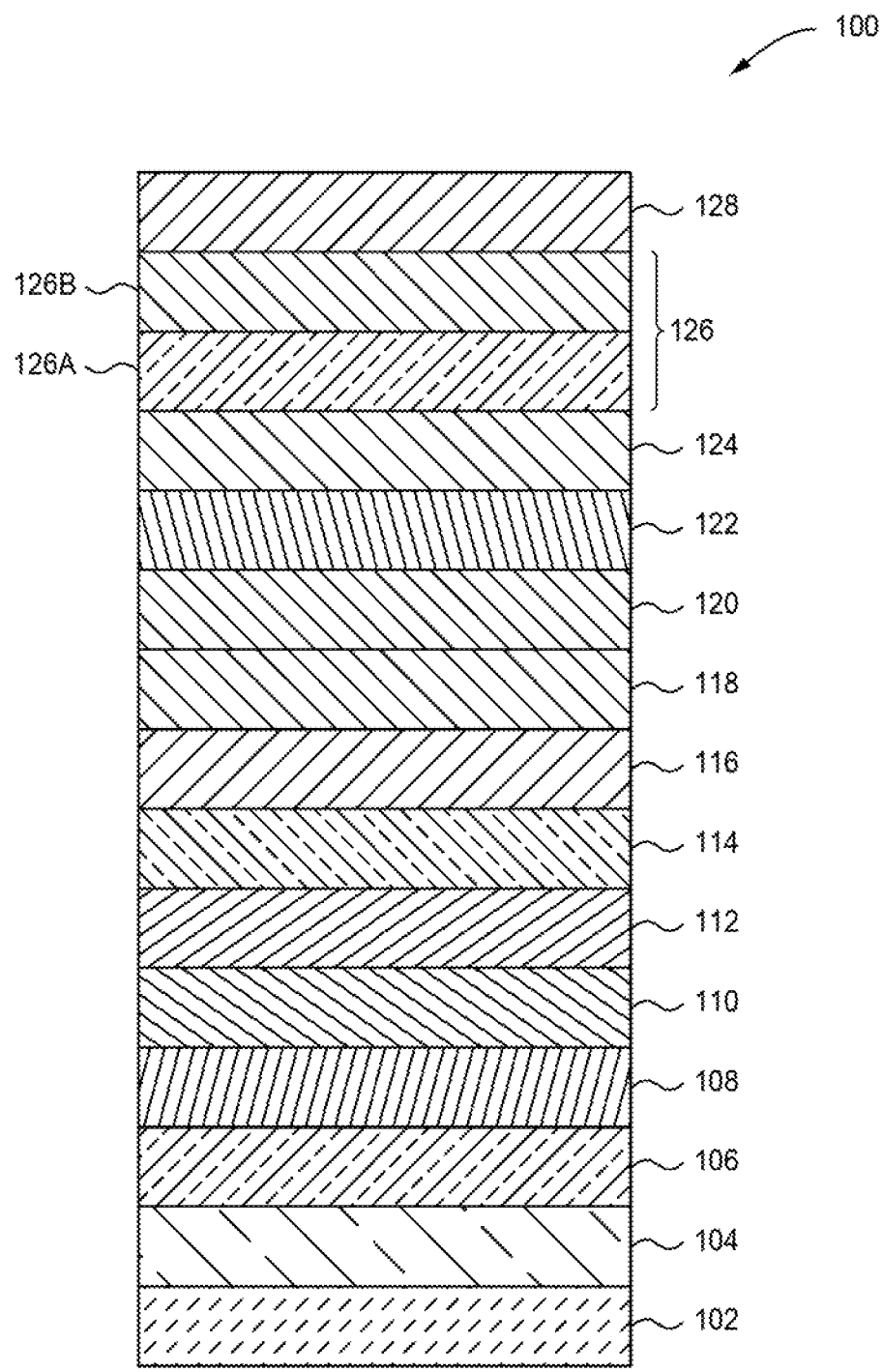
FIG. 1 is a schematic illustration of a magnetic tunnel junction (MTJ) stack, according to one or more embodiments.

In one example embodiment, a film stack for a magnetic tunnel comprises a substrate, a magnetic reference layer disposed over the substrate, and a tunnel barrier layer disposed over the magnetic reference layer. The film stack further comprises a magnetic storage layer disposed over the tunnel barrier layer, and a capping layer disposed over the magnetic storage layer. Further, the film stack comprises at least one protection layer disposed between the magnetic reference layer and the tunnel barrier layer and disposed between the magnetic storage layer and the capping layer. Additionally, a material forming the at least one protection layer differs from at least one of a material forming the magnetic reference layer and a material forming the magnetic storage layer.

In one example embodiment, a method for forming a magnetic tunnel junction stack comprises depositing a magnetic reference layer over a substrate, depositing a tunnel barrier layer over the magnetic reference layer, and depositing a magnetic storage layer over the tunnel barrier layer. The method further comprises depositing a capping layer over the magnetic storage layer, and depositing at least one protection layer between the magnetic reference layer and the tunnel barrier layer and between the magnetic storage layer and the capping layer. Additionally, a material forming the at least one protection layer differs from at least one of the magnetic reference layer and the magnetic storage layer.

In one example embodiment, a film stack for a magnetic tunnel junction comprises a substrate, a magnetic reference layer disposed over the substrate, a first protection layer disposed over the magnetic reference layer, and a tunnel barrier layer disposed over the first protection layer. The film stack further comprises a magnetic storage layer disposed over the tunnel barrier layer, a second protection layer disposed over the magnetic storage layer, and a capping layer disposed over the second protection layer.

DETAILED DESCRIPTION

Embodiments of the present disclosure relate to magnetic tunnel junction (MTJ) stacks. The MTJ stacks may be incorporated in a film stack including upper and lower electrodes, wherein the MTJ stack is sandwiched therebetween the upper electrodes and the lower electrodes. The MTJ stack can be patterned to form a plurality of individual memory cells used in a magneto-resistive random-access memory (MRAM) or the like. In each MTJ stack of a memory cell the electrical resistance across the memory cell changes based on the relative magnetic moment polarity between a magnetic reference layer and a magnetic storage layer of the MTJ stack. The memory cells formed from the MTJ stacks operate when there is a voltage imposed across the cell or when there is a current passed through the cell. In response to the application of voltage of sufficient strength, the polarity of the switchable magnetic layer can be changed. During deposition, one or more of the magnetic reference layer and the magnetic storage layer may experience oxidation. The oxidation may result in reduced current flowing through the cell, resulting in reduced performance and/or possible failure of the corresponding memory cell. However, to at least mitigate the oxidation of the magnetic reference layer and the magnetic storage layer, a protective layer may be deposited over the magnetic reference layer and the magnetic storage layer. The protective layer at least partially prevents any layers deposited over the magnetic reference layer and the magnetic storage layer from oxidizing the magnetic reference layer and the magnetic storage layer.

FIG. 1 is a schematic illustration of a MTJ stack. FIG. 1 shows an MTJ stack 100 that includes a substrate 102. The substrate 102 may comprise a conductive layer of tungsten (W), tantalum nitride (TaN), titanium nitride (TiN), or other metal layers thereof. The substrate 102 may include one or more transistors and traces. Further, other elements to be used to form a memory containing the MTJ stack 100 may be fabricated on the substrate 102. The substrate 102 may a diameter of about 200 mm. Alternatively, the substrate 102 has a diameter of less than about 200 mm or greater than about 200 mm. Further, the substrate 102 may have a shape of a circle, a rectangular, or a square, among others.

A buffer layer 104 in the MTJ stack 100 is formed on the substrate 102. The buffer layer 104 comprises one or more layers comprising one or more of cobalt (Co), iron (Fe), boron (B), tantalum (Ta), and alloys thereof. For example, the buffer layer 104 may comprise $Co_xFe_yB_z$ (z is from about 10 wt. % to about 40 wt. %, y is from about 20 wt. % to about 60 wt. %, and x is equal to or less than 70 wt. %) and/or TaN. The buffer layer 104 improves adhesion of other layers within the MTJ stack 100 to the substrate.

A seed layer 106 is deposited over the buffer layer 104. The seed layer improves adhesion and seeding of subsequently deposited layers in the MTJ stack 100. For example, the seed layer 106 mitigates lattice mismatch between the buffer layer 104 and other layers within the MTJ stack 100 (e.g., a first pinning layer 108). The seed layer 106 has a face-centered-cubic (fcc) lattice structure. The seed layer 106 may comprise one of platinum (Pt), chromium (Cr), ruthenium (Ru), and an alloy thereof The first pinning layer 108 is formed on the seed layer 106 by sputtering. Further, the first pining layer 108 has an fcc lattice structure. The first pinning layer 108 comprises a Co layer and/or one or more bilayers. Each bilayer comprises a first interlayer of Co and a second interlayer of nickel (Ni) or Pt.

A coupling layer 110 is formed here over the first pinning layer 108. Further, the coupling layer 110 has an fcc lattice structure. Additionally, the coupling layer 110 may be a synthetic anti-ferrimagnetic (SyF) coupling layer. The coupling layer 110 can be formed of one or more of Ru, Rh, Cr, or iridium (Ir).

A second pinning layer 112 is formed over the coupling layer 110. The second pinning layer 112 has an fcc lattice structure. Further, the second pinning layer 112 can comprise a Co layer and/or a bilayer comprising a first interlayer of Co and a second interlayer of Ni or Pt.

The first pinning layer 108 and the second pinning layer 112 each comprise similar magnetic moments. Accordingly, the first pinning layer 108 and the second pinning layer 112 react similarly when an external magnetic field is applied to the MTJ stack 100. The coupling layer 110 maintains an anti-parallel alignment of the magnetic moments of the first pinning layer 108 and the second pinning layer 112. Further, as the coupling layer 110 is located between the first pinning layer 108 and the second pinning layer 112, when surface atoms of the first pinning layer 108 and the second pinning layer 112 are exposed to a magnetic field the atoms align with surface atoms of the coupling layer 110. Accordingly, the orientation of the magnetic moment of each of the first pinning layer 108 and the second pinning layer 112 is pinned or retained.

A structure blocking layer 114 is formed over the second pinning layer 112. The structure blocking layer comprises Ta, molybdenum (Mo), tungsten (W), or combinations thereof. The structure blocking layer 114 has a body-centered-cubic (bcc) lattice structure as-formed. Further, the lattice structure of the structure blocking layer 114 differs from the lattice structure of the first pinning layer 108 and second pinning layer 112.

A magnetic reference layer 116 is formed over the structure blocking layer 114. The magnetic reference layer 116 has a bcc lattice structure. The magnetic reference layer 116 may be formed from one or more of Co, Fe, B, and an alloy thereof. For example, the magnetic reference layer 116 may be formed from $Co_xFe_yB_z$, where z is from about 10 wt. % to about 40 wt. %, y is from about 20 wt. % to about 60 wt. %, and x is equal to or less than 70 wt. %. The thickness of the magnetic reference layer 116 is in a range of about 5 Å to about 20 Å

A first protection layer 118 is formed over the magnetic reference layer 116. Further, the first protection layer 118 may be formed from a material different than that of the magnetic reference layer 116. For example, the first protection layer 118 may be formed from magnesium (Mg), hafnium (Hf), or an alloy thereof. The first protection layer 118 protects oxidization of the magnetic reference layer 116 during the deposition of other layers. Further, the thickness of the first protection layer 118 may be in a range for about 0.1 Å to about 3 Å. Additionally, when the first protection layer 118 is formed from Mg, the thickness of the first protection layer 118 is in a range of about 0.5 Å to about 1 Å, or in a range of about 0.3 Å to about 3 Å. Further, when the first protection layer 118 is formed from Hf, the thickness of the first protection layer 118 is in a range of about 0.3 Å to about 0.7 Å, or in a range of about 0.1 Å to about 3 Å. Additionally, the thickness of the first protection layer 118 is less than a thickness of the magnetic reference layer 116.

A tunnel barrier layer 120 is formed over the first protection layer 118. The tunnel barrier layer 120 has a bcc lattice structure. The tunnel barrier layer 120 comprises an insulating material. Further, the tunnel barrier layer 120 may be fabricated from a dielectric material such as MgO among other metal oxides.

The first protection layer 118 mitigates the oxidization of the magnetic reference layer 116 when another layer is deposited over the magnetic reference layer 116. For example, the first protection layer 118 prevents the magnetic reference layer 116 from being oxidized during the deposition of the tunnel barrier layer 120 (or another layer of the MTJ stack 100). The first protection layer 118 forms a layer of protection between the magnetic reference layer 116 and the tunnel barrier layer 120 (or another layer of the MTJ stack 100) such that the material making up the tunnel barrier layer 120 does not interact with and oxidize the magnetic reference layer 116.

A magnetic storage layer 122 is formed over the tunnel barrier layer 120. The magnetic storage layer 122 has a bcc lattice structure. The magnetic storage layer 122 comprises a $Co_xFe_yB_z$ alloy, where z is from about 10 wt. % to about 40 wt. %, y is from about 20 wt. % to about 60 wt. %, and x is equal to or less than 70 wt. %. Additionally, or alternatively, the magnetic storage layer 122 can comprise one or more layers of Ta, Mo, W, or Hf, or combinations thereof. The thickness of the magnetic storage layer 122 is in a range of about 5 Å to about 50 Å

A second protection layer 124 is formed over the magnetic storage layer 122. The second protection layer 124 may be formed from a material different than that of the magnetic storage layer 122. For example, the second protection layer 124 may be formed from Mg, Hf, or an alloy thereof. The second protection layer 124 protects oxidization of the magnetic storage layer 122 during the deposition of other layers. Further, the thickness of the second protection layer 124 may be in a range for about 0.1 Å to about 3 Å. Additionally, when the second protection layer 124 is formed from Mg, the thickness of the second protection layer 124 is in a range of about 0.5 Å to about 1 Å, or in a range of about 0.3 Å to about 3 Å. Further, when the first protection layer 118 is formed from Hf, the thickness of the second protection layer 124 is in a range of about 0.3 Å to about 0.7 Å, or in a range of about 0.1 Å to about 3 Å. The thickness of the second protection layer 124 is less than the thickness of the magnetic storage layer 122.

One or more of a composition and a thickness of the tunnel barrier layer 120 may be selected so as to create a large tunnel magnetoresistance ratio (TMR) in the tunnel barrier layer 120. The TMR is a measurement of a change in resistance in the MTJ stack 100 from the anti-parallel state ($R_{ap}$) to the parallel state ($R_p$) and can be expressed as a percentage using the formula (($R_{ap}-R_p$)/$R_p$). When a bias is applied to the MTJ stack 100, the tunnel barrier layer 120 is traversed by spin-polarized electrons. Further, the transmission of electrons through the tunnel barrier layer 120 results in electrical conduction between the magnetic reference layer 116 and the magnetic storage layer 122. Additionally, the inclusion of the first protection layer 118 and/or the second protection layer 124 increases the TMR and the perpendicular magnetic anisotropy (PMA) of the MTJ stack 100.

A capping layer 126 is formed over the second protection layer 124. The capping layer 126 may be comprised of one or more interlayers. For example, the capping layer 126 includes one or more of a first capping interlayer 126A and a second capping interlayer 126B. The first capping interlayer 126A can be fabricated from a dielectric material such as MgO and/or an Fe oxide. Further, the first capping interlayer 126A may further comprise Ru and/or Ir. The second capping interlayer 126B comprises a metallic material such as Ru, Ir, Ta, or combinations thereof. Further, the second capping interlayer 126B is formed over the first capping interlayer 126A. The first capping interlayer 126A may act as an etch stop layer for hard mask etching and protects the MTJ stack 100 from corrosion. The second capping interlayer 126B is configured to electrically communicate with transistors or contacts when the MTJ stack 100 is patterned. The lattice structures of the first capping interlayer 126A and the second capping interlayer 126B can vary depending upon the composition of each interlayer.

The second protection layer 124 mitigates the oxidization of the magnetic storage layer 122 when another layer is deposited over the magnetic storage layer 122. For example, the second protection layer 124 prevents the magnetic storage layer 122 from being oxidized during the deposition of the capping layer 126 (or another layer of the MTJ stack 100). The second protection layer 124 forms a layer of protection between the magnetic storage layer 122 and the capping layer 126 (or another layer of the MTJ stack 100) such that the material making up the capping layer 126 does not interact with and oxidize the magnetic storage layer 122.

A hardmask layer 128 may be disposed over the capping layer 126. Further, the hardmask layer 128 may be formed over one of the first capping interlayer 126A and the second capping interlayer 126B. The hardmask layer 128 protects the MTJ stack 100 can be patterned during subsequent operations. The hardmask layer 128 can be formed by various processes depending upon its composition.

Figure 2A:
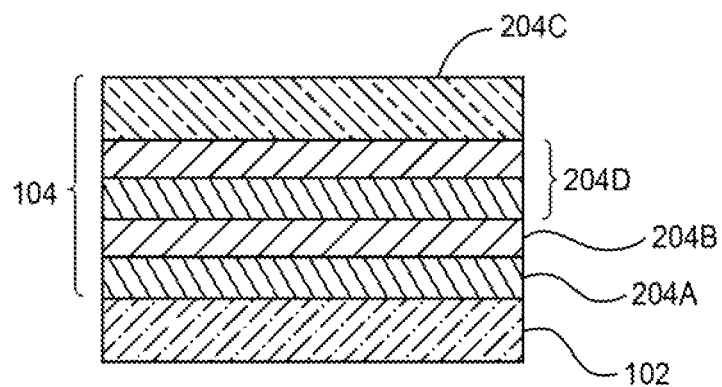
FIGS. 2A-2F are magnified views of layers of an MTJ stack, according to embodiments of the present disclosure.

FIGS. 2A-2F are schematic illustrations of layers of an MTJ stack fabricated according to embodiments of the present disclosure. FIG. 2A is a magnified view of the buffer layer 104 according to embodiments of the present disclosure. The buffer layer 104 comprises Ta or TaN, or a layered stack of Ta and TaN, and, in some examples, comprises $Co_xFe_yB_z$, alone or in combination with Ta, TaN, or a Ta/TaN layered stack. In an example of the buffer layer 104, the buffer layer 104 comprises at least one bilayer 204D. The at least one bilayer 204D comprises a first buffer interlayer 204A and a second buffer interlayer 204B formed in an alternating fashion on the substrate 102 for at least one iteration of the at least one bilayer 204D. Alternatively, the first buffer interlayer 204A comprises Ta and the second buffer interlayer 204B comprises TaN, and the first buffer interlayer 204A is in contact with the substrate 102. Further, the first buffer interlayer 204A comprises TaN and the second buffer interlayer 204B comprises Ta, and thus TaN is in direct contact with the substrate 102. The buffer layer 104 may additionally include a third buffer layer 204C formed over the at least one bilayer 204D. In this example, the third buffer layer 204C is fabricated from $Co_xFe_yB_z$. Further, the thickness of the third buffer layer 204C may be up to about 10 Å. Thus, depending upon the configuration of the buffer layer 104, a thickness of the buffer layer 104 ranges from about 1 Å thick to about 60 Å. In an example where the third buffer layer 204C $Co_xFe_yB_z$ is employed, z is from about 10 wt. % to about 40 wt. %, y is from about 20 wt. % to about 60 wt. %, and x is equal to or less than 70 wt. %.

Figure 2B:
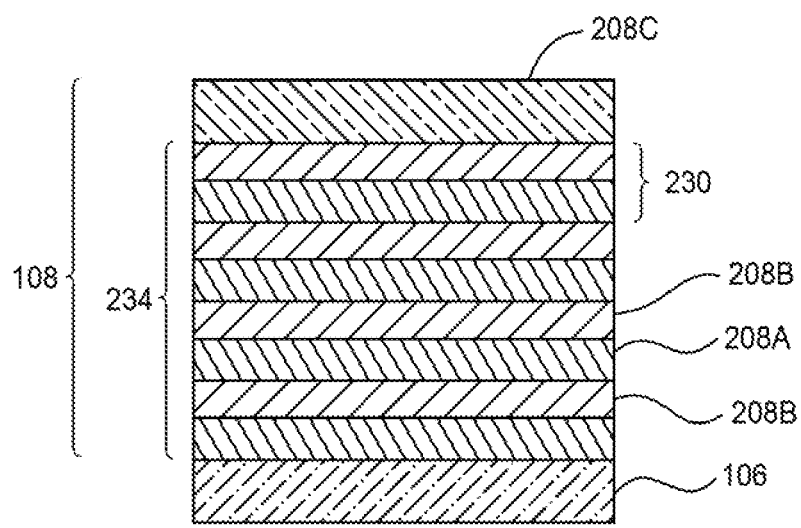

FIG. 2B is a magnified view of the first pinning layer 108 according to an embodiment of the present disclosure. The first pinning layer 108 is fabricated from at least one bilayer 230. Further, when the first pinning layer 108 includes two or more bilayers 230 are employed, the two or more bilayers 230 form a bilayer stack 234. Each bilayer 230 is fabricated from a first interlayer 208A and a second interlayer 208B. The bilayers of the first pinning layer 108 are expressed as $(X/Y)_n$, $(208A/208B)_n$, where each bilayer is a combination of a first material X and a second, different, material Y, and where n is a number of bilayers in the first pinning layer 108. The at least one bilayer 230 may comprise a thickness from about 2 Å to about 16 Å. In one example, the first interlayer 208A comprises Co and has a thickness from about 1 Å to about 8 Å. Further, the second interlayer 208B comprises Pt or Ni, or combinations or alloys thereof, and has a thickness from about 1 Å to about 8 Å. Additionally, or alternatively, the at least one bilayer 230 is formed directly on and in contact with the seed layer 106, and an overlayer 208C is formed on top of the at least one bilayer 230. The overlayer 208C may be in contact with the coupling layer 110. The overlayer 208C may have a thickness from about 1 Å to about 10 Å. Further, the overlayer 208C may be comprised of Co.

An overall thickness of the first pinning layer 108 may be from about 1 nm to about 18 nm. Further, one or more transitional layers may be formed between the first pinning layer 108 and the seed layer 106 that do not negatively affect the properties of the MTJ stack 100.

Figure 2C:
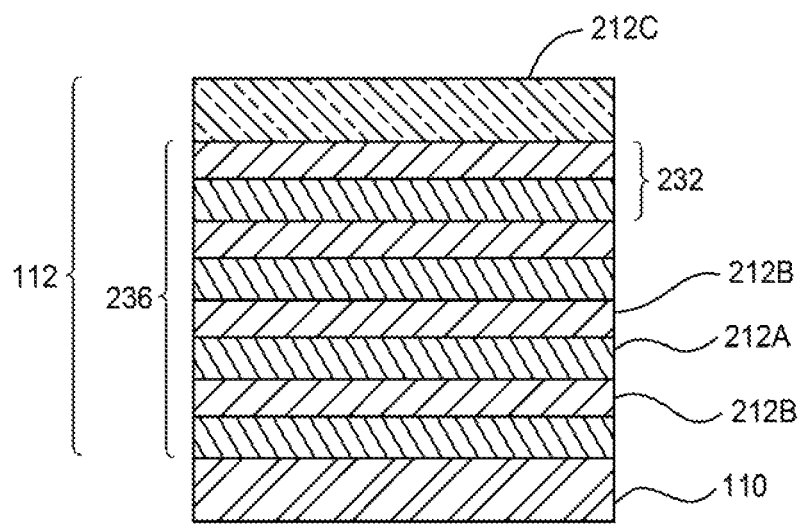

FIG. 2C is a magnified view of the second pinning layer 112 according to embodiments of the present disclosure. In an embodiment, the second pinning layer 112 includes at least one bilayer 232. Each bilayer 232 comprises a first interlayer 212A that can be Co and a second interlayer 212B that can be Pt or Ni, or combinations or alloys thereof. When two or more bilayers such as the bilayer 232 are employed in the second pinning layer 112, the two or more bilayers may be referred to as a bilayer stack 236. The at least one bilayer 232 of the second pinning layer 112 is expressed as $(X/Y)_n$, $(212A/212B)_n$, where n is a number of bilayers. While n=4 in the example in FIG. 2C, in alternate embodiments, n is from 1 to 5. In an embodiment, the at least one bilayer 232 comprises a total thickness from about 2 Å to about 16 Å. In one example, the first interlayer 212A is a Co layer having a thickness of about 1 Å to about 8 Å and the second interlayer 212B has a thickness from about 1 Å to about 8 Å. Further, the second interlayer 212B comprises Ni or Pt or combinations or alloys thereof.

The second pinning layer 112 may comprise an overlayer 212C of Co formed on top of the at least one bilayer 232. Alternatively, no overlayer 212C is present. The overlayer 212C has a thickness from about 1 Å to about 10 Å. Further, an overall thickness of the second pinning layer 112, which may comprise one or more layers including the at least one bilayer 232, is from about 0.3 nm to about 15 nm. Additionally, a transitional layer may be employed between the at least one bilayer 232 and the second pinning layer 112 or between the at least one bilayer 232 and the coupling layer 110, or both, where such transition layer(s) do not affect performance of the MTJ stack 100.

The first pinning layer 108 and second pinning layer 112 each may comprise the same interlayer composition and/or a differing interlayer thickness. Alternatively, the first pinning layer 108 and second pinning layer 112 each comprise different compositions and/or thicknesses. Further, the first pinning layer 108 includes at least one bilayer comprising a first interlayer of Co and a second interlayer of Pt, and further comprises a Co overlayer formed over the at least one bilayer. The second pinning layer 112 may be formed over the coupling layer 110 and may include one or more bilayers. The one or more bilayers of the second pinning layer 112 include a first interlayer of Co and a second interlayer of Pt. Further, the first pinning layer 108 includes at least one bilayer comprising a first interlayer of Co and a second interlayer of Ni, and additionally includes a Co overlayer formed over the at least one bilayer such that the Co overlayer is in contact with the coupling layer 110 formed from Ir. Further, the second pinning layer 112 includes one or more bilayers. Additionally, the one or more bilayers of the second pinning layer 112 include a first interlayer of Co and a second interlayer of Pt.

Figure 2D:
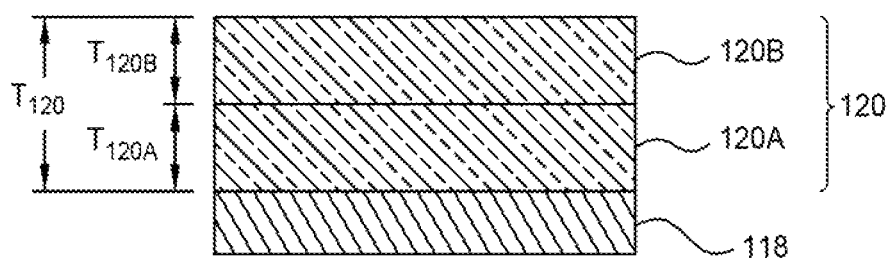

FIG. 2D is a magnified view of an example tunnel barrier layer 120 according to one or more embodiments. Tunnel barrier layer 120 may have an overall thickness $T_{120}$. Further, the tunnel barrier layer 120 may include one or more portions. The first portion 120A may have a thickness $T_{120A}$. The thickness $T_{120A}$ is from about 10% to about 90% of a total thickness $T_{120}$ of the tunnel barrier layer 120, or from 40% to 60% of the total thickness. The second portion 120B may have a second thickness $T_{120B}$. Further, the sum of $T_{120B}$ and $T_{120A}$ is the total thickness $T_{120}$ of the tunnel barrier layer 120. The total thickness of the tunnel barrier layer 120 is from about 1 Å to about 15 Å.

Figure 2E:
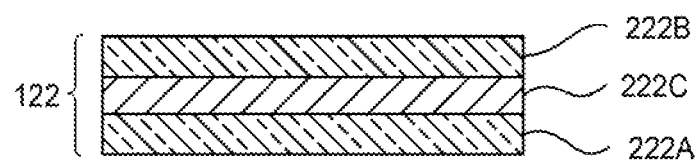

FIG. 2E is a magnified view of an example magnetic storage layer 122, according to one or more embodiments. As shown in FIG. 2E, a first magnetic layer 222A of the magnetic storage layer 122 and a second magnetic layer 222B of the magnetic storage layer 122 are each fabricated from $Co_xFe_yB_z$. A third layer 222C fabricated from Ta, Mo, W, Hf, or combinations thereof is disposed therebetween, and it contains dopants such as boron, oxygen, or other dopants. The magnetic storage layer 122 is thus fabricated from three layers, a first magnetic layer 222A and a second magnetic layer 222B, and a third layer 222C disposed between the first magnetic layer 222A and the second magnetic layer 222B. The third layer 222C strengthens a pinning moment perpendicular to the substrate plane (e.g., a plane perpendicular to the substrate 102), which promotes magnetic anisotropy, a directional dependence of the structure's magnetic properties.

Figure 2F:
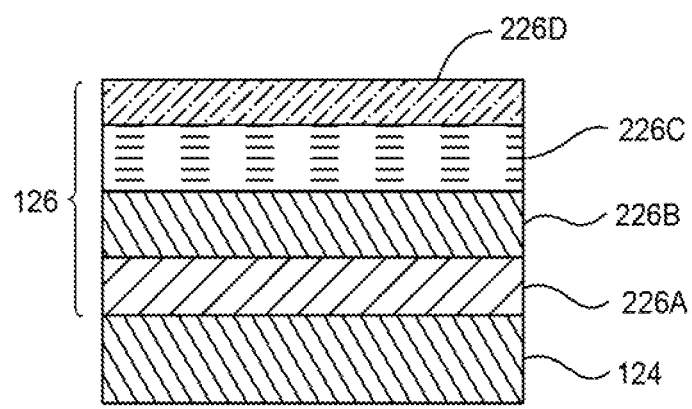

FIG. 2F is a magnified view of an example capping layer 126 according to an embodiment of the present disclosure. A total thickness of the capping layer 126 is from about 2 Å to about 120 Å. Further, the capping layer 126 comprises one or more interlayers. A first capping interlayer 226A is fabricated from MgO or another iron-containing oxide formed directly on the second protection layer 124 to a thickness from about 2 Å to about 10 Å. On top of the first capping interlayer 226A, a second capping interlayer 226B of Ru, Ir, or combinations thereof is formed to a thickness from 1 Å to about 30 Å. Further, a third capping interlayer 226C is optionally formed of Ta on the second capping interlayer 226B to a thickness of 1 Å to about 30 Å. Alternatively, the third capping interlayer 226C may be omitted. Further, a second capping interlayer 226D is optionally formed on the third capping interlayer 226C and is formed of Ru, Ir, or combinations thereof to a thickness of up to about 50 Å. Alternatively, the capping layer 126 comprises only the first capping interlayer 226A, only the first capping interlayer 226A and the second capping interlayer 226B, or only the first capping interlayer 226A, the second capping interlayer 226B, and a third capping interlayer 226C. Additionally, or alternatively, transitional layers may be used in between some or all of the first capping interlayer 226A, the second capping interlayer 226B, and the third capping interlayer 226C, or may be between the capping layer 126 and the second protection layer 124, such that the performance of the MTJ stack 100 is not negatively impacted by the transitional layer(s).

Figure 3:
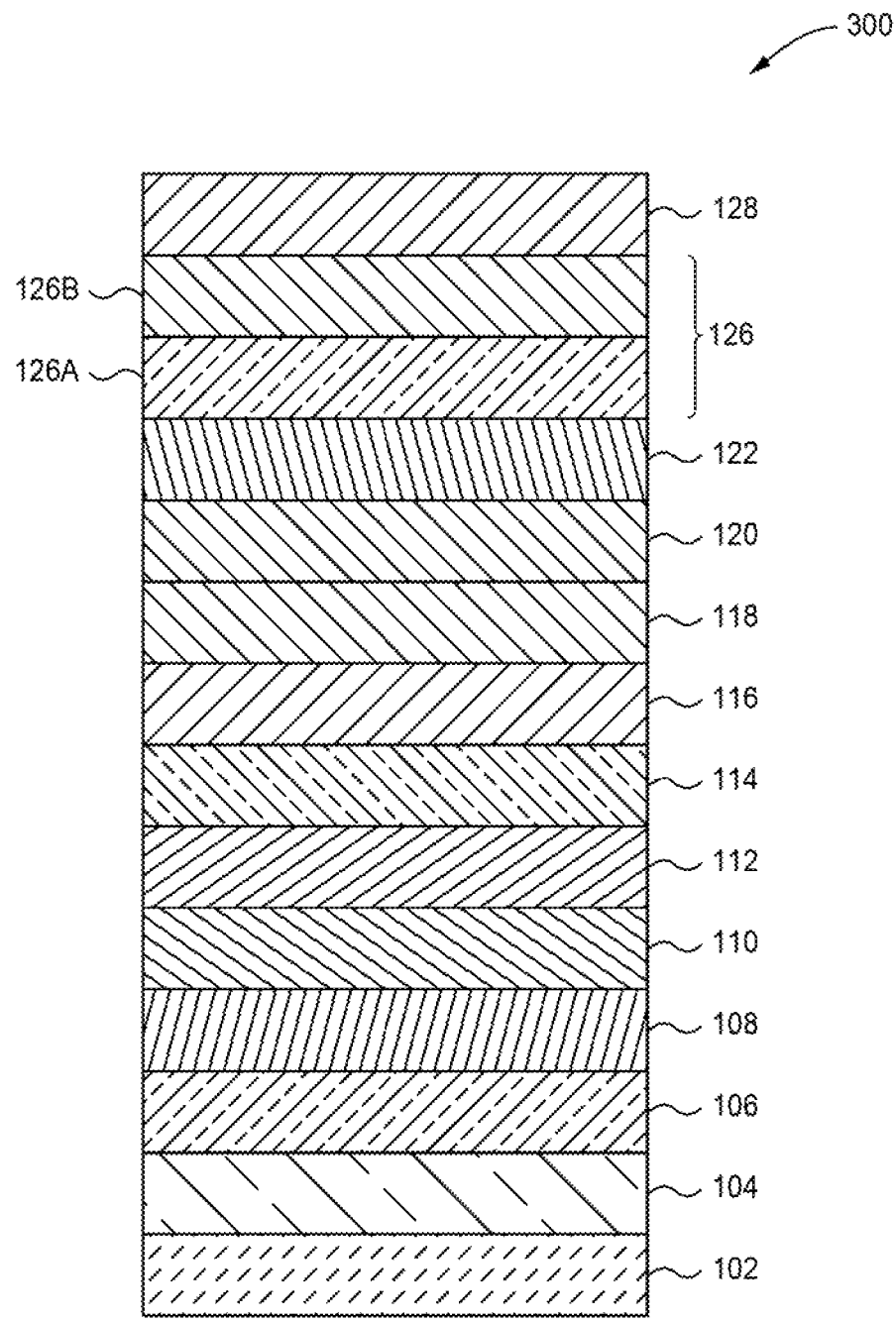
FIGS. 3 and 4 are schematic illustrations of a MTJ stack, according to one or more embodiments.

FIG. 3 illustrates an MTJ stack 300, according to one or more embodiments. The MTJ stack 300 is configured similar to that of MTJ stack 100; however the protection layer 124 has been omitted. Accordingly, the MTJ stack 300 includes one protection layer, the first protection layer 118 disposed between the tunnel barrier layer 120 and the magnetic reference layer 116. Utilizing the first protection layer 118 protects oxidization of the magnetic reference layer 116 during the deposition of one or more layers over the magnetic reference layer 116. Accordingly, the reduction of current flowing through the MTJ stack in response to the oxidation of the magnetic reference layer 116 is mitigated. Further, the second protection layer 124 may be omitted as the magnetic storage layer 122 may not be substantially oxidized by the capping layer 126 or other layers disposed over the magnetic storage layer 122. For example, the deposition of the capping layer 126 and/or another layer may not affect the magnetic storage layer 122 and a corresponding reduction of current flowing through the MTJ stack is not experienced.

Figure 4:
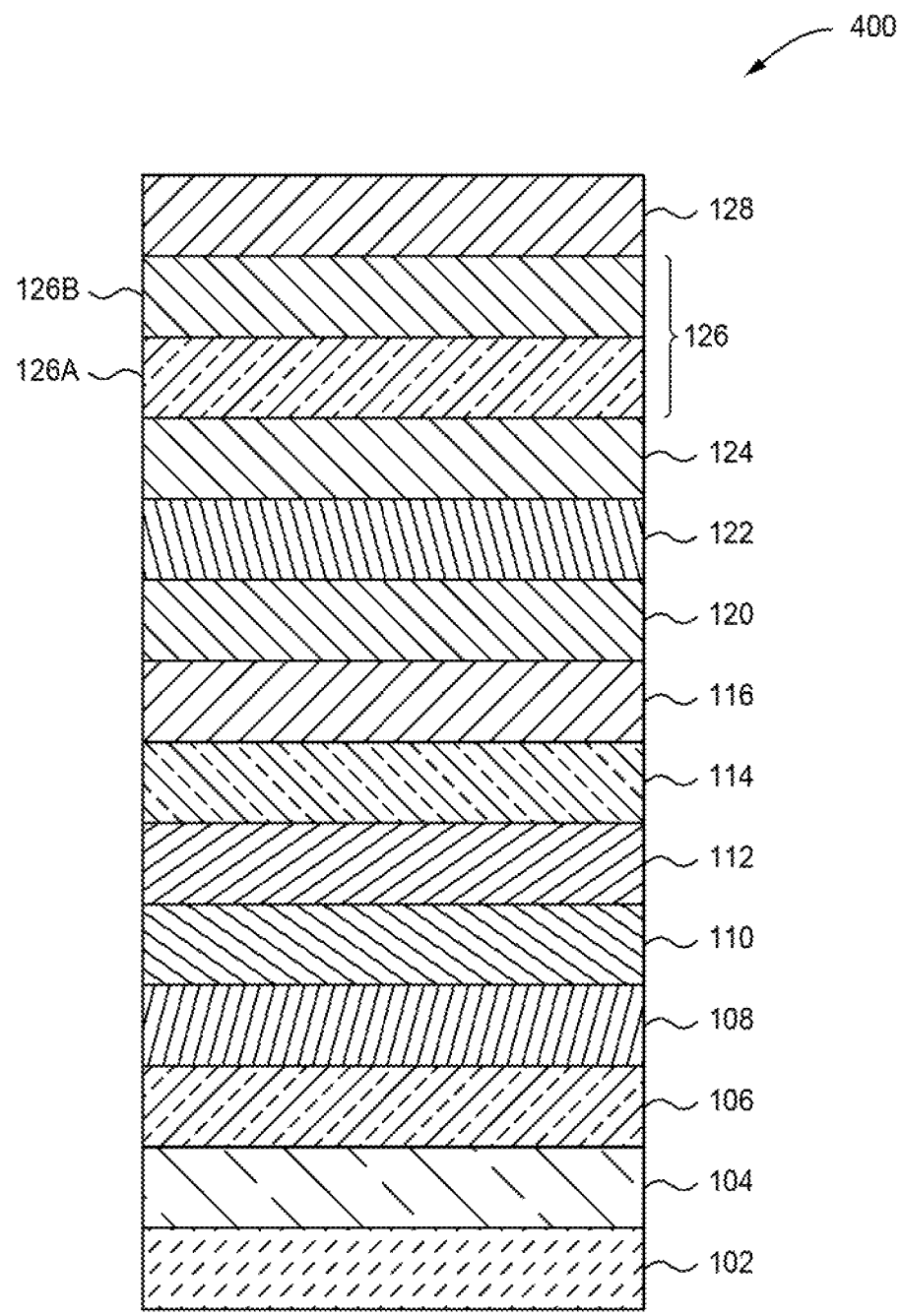

FIG. 4 illustrates an MTJ stack 400, according to one or more embodiments. The MTJ stack 400 is configured similar to that of MTJ stack 100; however the protection layer 118 has been omitted. Accordingly, the MTJ stack 400 includes one protection layer, the second protection layer 124 disposed between the magnetic storage layer 122 and the capping layer 126. Utilizing the second protection layer 124 protects oxidization of the magnetic storage layer 122 during the deposition of one or more layers over the magnetic storage layer 122. Accordingly, the reduction of current flowing through the MTJ stack in response to the oxidation of the magnetic storage layer 122 is mitigated. Further, the first protection layer 118 may be omitted as the magnetic reference layer 116 may not be substantially oxidized by the tunnel barrier layer 120 or other layers disposed over the magnetic reference layer 116. For example, the deposition of the tunnel barrier layer 120 and/or another layer may not affect the magnetic reference layer 116 and a corresponding reduction of current flowing through the MTJ stack is not experienced.

Figure 5:
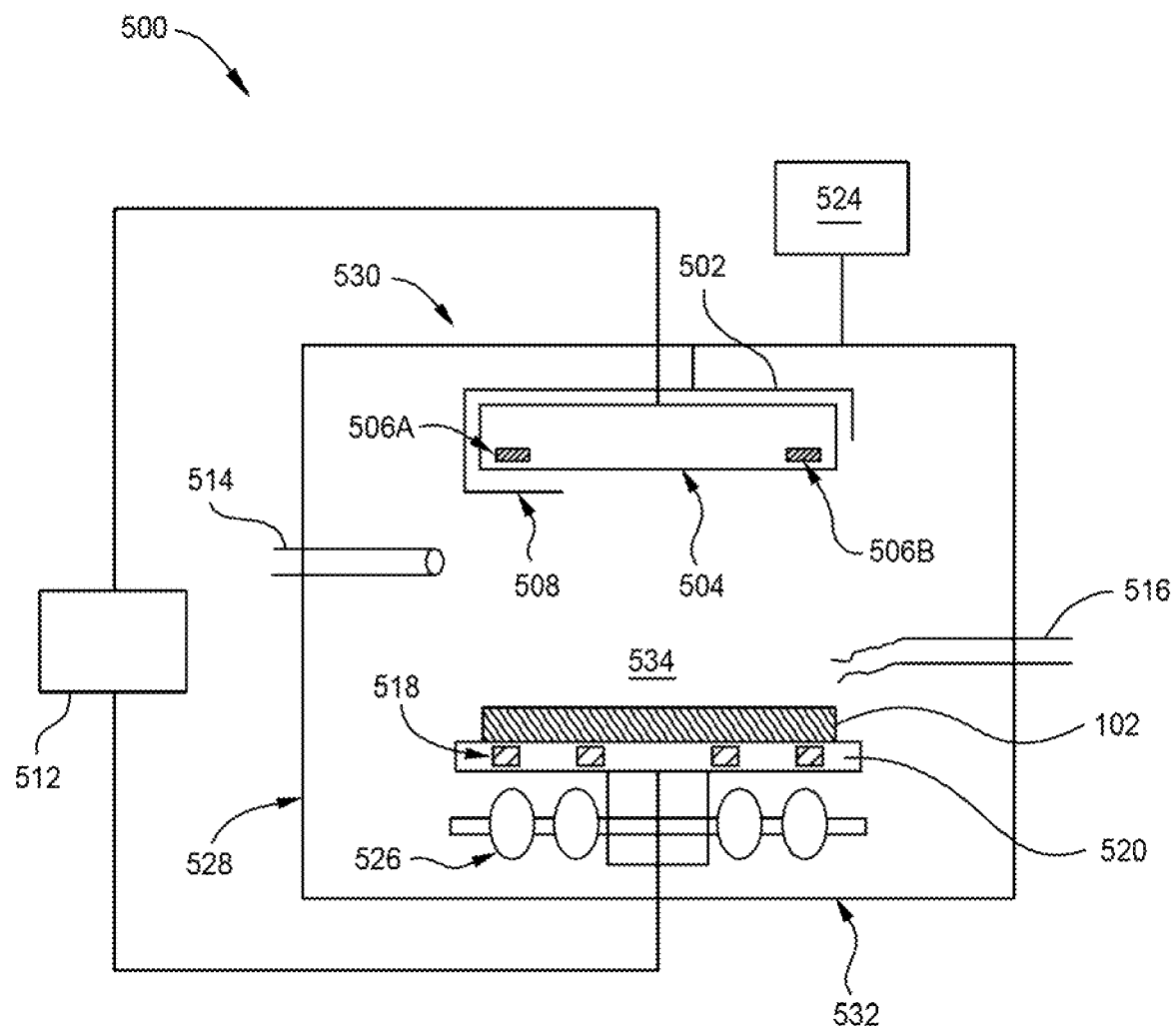
FIG. 5 is an example process chamber, according to embodiments of the present disclosure.

FIG. 5 shows a physical vapor deposition (PVD) chamber 500 according to embodiments described herein. As discussed above, a plurality of PVD chambers can be employed to form the MTJ stack 100, 300 and/or 400. The PVD chamber 500 is an example PVD chamber that can be configured to form one or more layers of a MTJ stack (e.g., the MTJ stack 100, 300 and/or 400). The PVD chamber 500 comprises a chamber top 530, a chamber bottom 532, and a chamber wall 528. A target support 502, which is adapted for receiving a target cartridge 504 comprising at least one sputtering target, is coupled to the chamber top 530. The target support 502 may be adapted for supporting and/or driving a rotatable target such as the shielded target discussed herein. The target cartridge 504 can be fabricated from conductive materials such as copper-based materials, or can be fabricated from the same material as a target coupled to the cartridge such as the target 506A or 506B. Alternatively, the cartridge can be fabricated from a non-conductive material and can comprise conductive elements.

In one example, the PVD chamber 500 includes the target cartridge 504 which can comprise one or more sputtering targets illustrated as 506A and 506B. A shielding mechanism 508 is disposed opposite the target support 502 and selectively shields one or more targets (506A/506B) in the target cartridge 504 from plasma during the MTJ stack formation.

Further in the example PVD chamber 500, a substrate support pedestal 520 is positioned opposite the target cartridge 504 towards the chamber bottom 532, and a substrate 102 is disposed on the substrate support pedestal 520 when the substrate support pedestal 520 is at a predetermined temperature for deposition as discussed above. One or more heating elements 518 may be coupled to or disposed within the substrate support pedestal 520. The heating elements 518 can be used to raise and/or lower the temperature of the substrate 102 during MTJ stack formation. A controller 524 is in communication with the PVD chamber 500 and is configured to execute a plurality of instructions to form the MTJ stack. The controller 524 is configured to execute instructions from a computer-readable medium. The instructions executed by the controller 324 can include various aspects forming a MTJ stack, including which one or more targets 506A/506B to be exposed or shielded during a deposition process, a pressure of the PVD chamber, and/or a temperature of the PVD chamber before, during, and after the formation of each layer of the MTJ stack. The instructions can further include if and/or when to transfer the substrate to a different PVD chamber other than the PVD chamber 500.

The PVD chamber 500 further includes a power supply 512 for applying a voltage to a cathode (which may for instance be the target cartridge 504 and/or the target(s) 506A/506B) and an anode (which may for instance be the substrate 102). The targets 506A and 506B are shown as a cathode and the substrate support pedestal 520 is shown as an anode in FIG. 5. In some examples, each target 506A and 506B acts as a separate electrode. The applied voltage creates an electrical field in the processing region 534, which may be used to form plasma to sputter the one or more targets 506A/506B in the target cartridge 504.

The PVD chamber 500 described herein may have a gas manifold (not shown) coupled to a first gas inlet 514 and a second gas inlet 516 formed in a chamber wall 528. The gas manifold is configured to supply gases from gas sources (not pictured) including gases such as Ar, Xe, and Kr that can be used to form plasma, as well as He and $H_2$, and/or $O_2$ or $N_2$ if the PVD chamber 500 is configured to form oxide and/or nitride layers or interlayers. A first gas inlet 514 supplies gas towards the substrate surface to be coated. The first gas inlet 514 may be directed to the substrate receiving portion in order to provide a first gas to the substrate during the deposition process. A second gas inlet 516 may be provided for supplying gas to be turned into plasma within the PVD chamber 500 (for instance a noble gas, such as argon). The locations and positions of the first gas inlet 514 and the second gas inlet 516 can vary depending upon the embodiment. Further, more than two gas inlets can be employed in the PVD chamber 500.

The heating elements 518 in the substrate are adjusted to bring the substrate 102 to a predetermined temperature. Alternatively, or additionally, the PVD chamber 500 comprises a plurality of radiant heat lamps 526 that may be used to raise or lower the temperature of the substrate 102. While the plurality of radiant heat lamps 526 are shown in FIG. 5 as being disposed underneath the substrate support pedestal 520, the plurality of radiant heat lamps 526 can be disposed above the substrate 102 and/or in other positions within the chamber relative to the substrate 102. Additionally, or alternatively, a laser may be used to control the temperature of the substrate 102. The laser can be configured to operate in a laser chamber that is coupled to the PVD chamber 500 or to a transfer chamber that is also coupled to the PVD chamber 500. The adjustment of the temperature of the substrate can be in response to execution of MTJ stack fabrication instructions executed by the controller 524.

One or more PVD chambers can be used as discussed above to form the MTJ stack (e.g., MTJ stack 100, 300, and/or 400). Further, the one or more PVD chambers can be configured as shown in FIG. 5 to form oxide layers or nitride layers.

Figure 6:
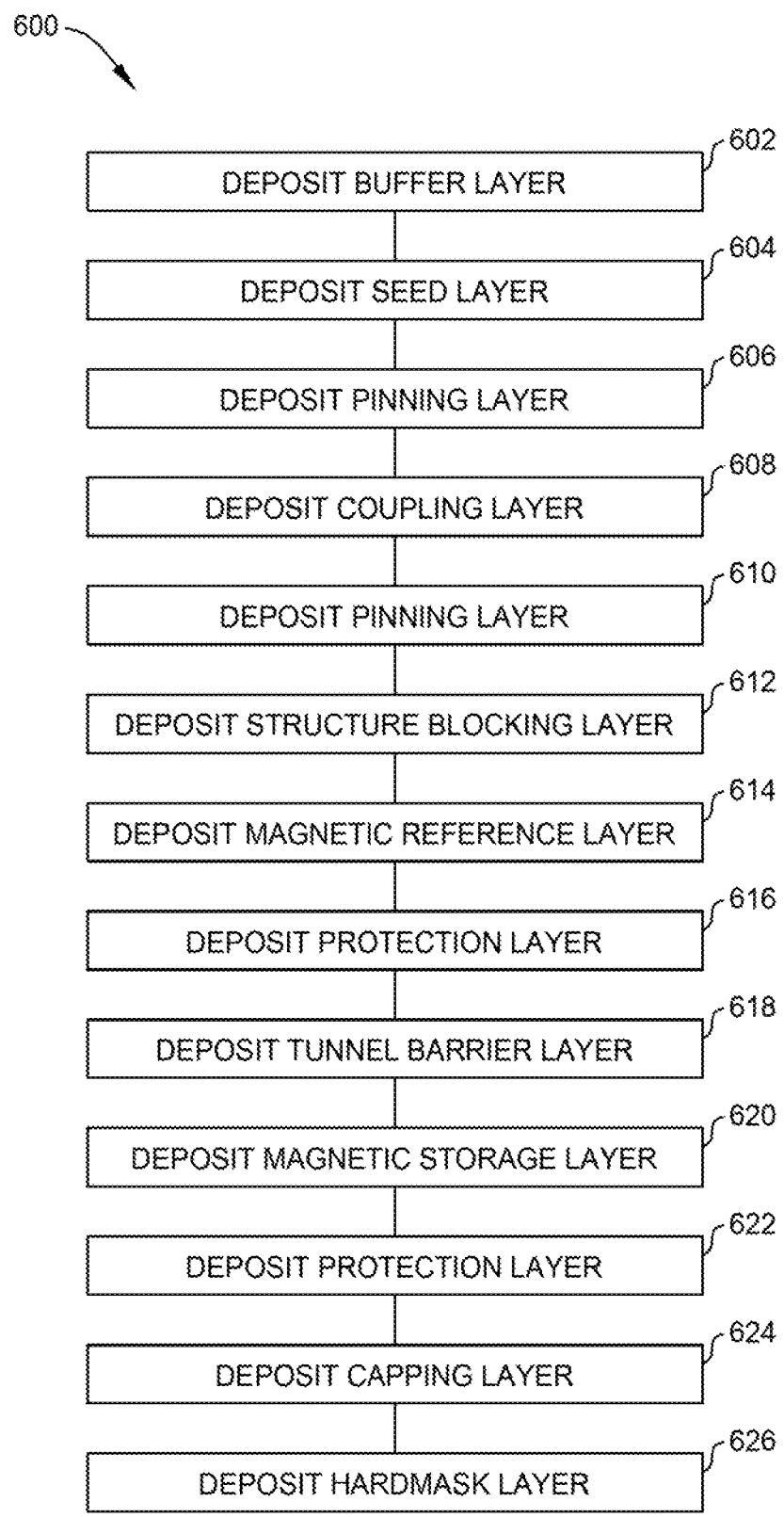
FIG. 6 is a flowchart of a method for forming a MTJ stack, according to one or more embodiments.

FIG. 6 is a flow diagram of a method 600 of fabricating a MTJ stack 100. The method 600 may executed in part one or more PVD chambers (e.g., the PVD chamber 500) of a PVD system configured to deposit thin film layers by sputtering.

The operations of the method 600 are performed using one or more gases including argon (Ar), helium (He), krypton (Kr), xenon (Xe), oxygen (02), or nitrogen ($N_2$) as a plasma species in the PVD chamber or chambers. The processing pressure in the PVD chambers during the method 600 can be from about 2 mTorr to about 3 mTorr. The substrate 102 can be moved among and between PVD chambers depending upon the composition of the sputtering target(s) used for each layer of the MTJ stack 100.

At operation 602 a buffer layer is deposited on a substrate. For example, the buffer layer 104 is deposited on the substrate 102. Further, before operation 602 the substrate 102 undergoes operations including degassing and pre-cleaning. Further, before operation 602, the substrate 102 is disposed within a PVD chamber (e.g., the PVD chamber 500). Additionally, the substrate 102 can comprise a plurality of layers including an MTJ contact formed during previous operations. The buffer layer 104 may be deposited on the substrate 102 by sputtering. For example, the buffer layer 104 may be deposited on the substrate 102 by sputtering one or more targets of the PVD chamber. During formation of the buffer layer 104, a sputtering target or targets comprising $Co_xFe_yB_z$, TaN, and/or Ta are sputtered in the PVD chamber using a plasma to form the buffer layer 104.

Operation 602 can be performed when the substrate 102 is at a temperature from about 20° C. to about 25° C. For example, the substrate temperature is controlled via a plurality of heaters in the substrate support pedestal, radiant heat lamps and/or a laser annealing operation can be performed on the substrate temperature. During formation of the buffer layer 104 and subsequent layers, the one or more PVD chambers used are maintained at vacuum pressure while the temperature may be varied.

At operation 604, a seed layer is deposited. For example, the seed layer 106 is deposited on the buffer layer 104 by sputtering. Further, the seed layer 106 may be deposited on the buffer layer 104 by sputtering a target in a PVD chamber. During operation 604, a temperature of the substrate 102 is from about 200° C. to about 600° C.

At operation 606, a pinning layer is deposited. For example, the first pinning layer 108 is deposited on the seed layer 106 by sputtering. Further, the first pinning layer 108 may be deposited on the seed layer 106 by sputtering a target in a PVD chamber. The first pinning layer 108 may be deposited in a PVD chamber by sputtering one or more targets using Ar plasma. A temperature of the substrate 102 during deposition of the first pinning layer 108 is from about 200° C. to about 600° C., and is at or below the substrate temperature during the operation 604. When the first pinning layer 108 is a Co layer, a Co target is sputtered using Ar plasma in a PVD chamber. Further, where the first pinning layer 108 comprises one or more bilayers, operation 606 uses a Co sputtering target to form the first interlayer of the bilayer and uses another sputtering target composed of a different element to form the second interlayer of the bilayer. Further, the Co sputtering target and the sputtering target of the other element, such as nickel or platinum, can be sputtered using Ar plasma in the same PVD chamber using multiple targets. Alternatively, each layer of the bilayer can be formed in separate PVD chambers. The plurality of sputtering targets is disposed in a single PVD chamber and sputtered using Ar plasma and/or Xe plasma. The interlayer depositions can be repeated for a plurality of iterations to form a plurality of bilayers of the first pinning layer 108.

At operation 608, a coupling layer is deposited. For example, the coupling layer 110 is deposited on the first pinning layer 108 by sputtering a target of Ru, Cr, Rh, or Ir in a PVD chamber using Ar, Kr, or Xe plasma. Further, a temperature of the substrate 102 during operation 620 is at or below the substrate temperature during the deposition of the first pinning layer 108.

At operation 610, a second pinning layer is deposited. For example, the second pinning layer 112 is deposited on the coupling layer 110. The temperature of the substrate 102 during deposition of the coupling layer 110 is about the same as the temperature of the substrate 102 during deposition of the first pinning layer 108 (from about 200° C. to about 600° C.). The second pinning layer 112 is formed of Co using a Co target and Ar plasma in the PVD chamber. Alternatively, the second pinning layer 112 includes a bilayer, and may or may not include a Co layer formed in contact with the bilayer.

Where at least one bilayer is formed as a part of the second pinning layer 112, the bilayer is formed in a PVD chamber in a similar manner as the bilayer formed as a part of the first pinning layer 108 and discussed above. In an embodiment, the second pinning layer 112 further comprises a Co layer formed over the at least one bilayer to a thickness of up to about 10 Å.

At operation 612, a structure blocking layer is deposited. For example, the structure blocking layer 114 is deposited on the second pinning layer 112. The structure blocking layer 114 may be formed in a PVD chamber that comprises sputtering targets including Ta, Mo, and/or W, depending upon an intended composition of the structure blocking layer 114. During operation 612, a temperature of the substrate 102 can be within the range from about −270° C. to about 100° C.

At operation 614, a magnetic reference layer is deposited. For example, the magnetic reference layer 116 is subsequently deposited on the structure blocking layer 114. The magnetic reference layer 116 can be formed in a PVD chamber using a sputtering target that is a $Co_xFe_yB_z$ alloy, or by using individual sputtering targets of Co, Fe, or B, or by a combination of an alloy sputtering target(s) and a single-element sputtering target(s), e.g., a CoFe target and a B target. Further, during deposition of the magnetic reference layer 116, a temperature of the substrate is from about −270° C. to about 100° C.

At operation 616, a protection layer is deposited. For example, the first protection layer 118 is deposited over (e.g., in contact with) the magnetic reference layer 116. The first protection layer 118 can be formed in a PVD chamber using a metal target such as Mg and/or Hf and Ar gas based plasma in the PVD chamber.

At operation 618, a tunnel barrier layer is deposited. For example, the tunnel barrier layer 120 may be deposited over the first protection layer 118. The temperature of the substrate 102 during operation deposition of the tunnel barrier layer 120 may vary. For example, a first portion of the tunnel barrier layer 120 is deposited while the substrate is at a first temperature (from about −270° C. to about 100° C.). Further, after a first portion of the tunnel barrier layer 120 is deposited, the substrate temperature may be raised to a second temperature to be in a range of about 300° C. to about 600° C., or from about 450° C. to about 500° C., and the second portion of the tunnel barrier layer 120 is deposited at the second temperature. The tunnel barrier layer 120 is formed in a PVD chamber using a metal-oxide target such as MgO and Ar gas based plasma. In an alternate embodiment, the tunnel barrier layer 120 is formed in the PVD chamber using a metal target such as Mg, Ti, Hf, Ta, or Al and Ar gas based plasma while 02 is present in the PVD chamber to form the metal-oxide.

At operation 620, a magnetic storage layer is deposited. For example, the magnetic storage layer 122 is formed in a PVD chamber. The magnetic storage layer 122 may be formed over the tunnel barrier layer 120. The temperature of the substrate deposited the magnetic storage layer 122 can be from about −270° C. to about 100° C. The formation of the magnetic storage layer 120 can occur in various ways depending upon the intended composition. The magnetic storage layer 122 can comprise one or more layers of $Co_xFe_yB_z$, and, in some examples, one or more layers of Ta, Mo, W, or Hf. As such, the deposition of the magnetic storage layer 122 in the PVD chamber can include Ar plasma and a $Co_xFe_yB_z$ alloy target, or individual targets of Co, Fe, and B, or a combination of an alloy target and an element target such as a CoFe target and a B target. Where the magnetic storage layer 122 comprises Ta, Mo, W, or Hf, a sputtering target of Ta, Mo, W, or Hf is sputtered in the chamber using plasma formed from Ar.

At operation 622, a protection layer is deposited. For example, the second protection layer 124 is deposited over (e.g., in contact with) the magnetic storage layer 122. The second protection layer 124 can be formed in a PVD chamber using a metal target such as Mg and/or Hf and Ar gas based plasma in the PVD chamber.

At operation 624, a capping layer is deposited. For example, the capping layer 126 is formed on the second protection layer 124. The capping layer 126 may comprise the first capping interlayer 126A formed in a PVD chamber that may be different than the PVD chamber where non-oxide layers are formed. The first capping interlayer 126A may be deposited in the PVD chamber by sputtering a Mg target using an Ar plasma in the PVD chamber. Alternatively, the first capping interlayer 126A may be formed in the PVD chamber using an MgO sputtering target and Ar plasma in a PVD chamber. Alternatively, the first capping interlayer 126A may be formed of Ru and/or Ir. The second capping interlayer 126B may be deposited on the first capping interlayer 126A in a different PVD chamber than that used to sputter the first capping interlayer 126A. The second capping interlayer 126B is formed in a PVD chamber using Ar plasma and one or more sputtering targets composed of Ru, Ir, and/or Ta.

At operation 626, a hardmask layer 128 is deposited over the capping layer 126. For example, the hardmask layer 128 may be deposited in a PVD chamber.

While method 600 is illustrated as including operations 616 and 622, one of the operations 616 and 622 may be omitted. For example, the operation 616 may be omitted and the operation 622 may be included. Alternatively, the operation 622 may be omitted and the operation 616 may be omitted.

The MTJ stack formed from method 600 can be subjected to one or more processes not illustrated. For example, the additional processes may include a pre-patterning anneal operation, which is followed by an MTJ patterning operation. Further, the additional processes can include a plurality of processes such as patterning the hardmask layer 128. The additional processes may include an operation to etch the MTJ stack 100 after the hardmask layer 128 is patterned to form a plurality of individual pillars from the MTJ stack 100 using the patterned hardmask layer as an etch mask.

Alternatively, or additionally, a thermal annealing operation is executed to repair, crystallize, and enhance lattice structures of the film stack, including the magnetic storage layer(s) and the magnetic reference layer(s) in the MTJ stack 100. The thermal annealing can act to further crystallize at least the material of the magnetic reference layer 116 and magnetic storage layer 122. The crystallization of the magnetic reference layer(s) and magnetic storage layer(s) upon deposition of those layers establishes the perpendicular anisotropy of the MTJ stack 100, while maintaining its desired electrical and mechanical properties.

While the foregoing is directed to embodiments of the present disclosure, other and further embodiments of the disclosure may be devised without departing from the basic scope thereof, and the scope thereof is determined by the claims that follow.

What is claimed is:

1. A film stack for a magnetic tunnel junction (MTJ), comprising:
   a substrate;
   a magnetic reference layer formed from a $Co_xFe_yB_z$ alloy, where z is from about 10 wt. % to about 40 wt. %, y is from about 20 wt. % to about 60 wt. %, and x is equal to or less than 70 wt. %, the magnetic reference layer disposed over the substrate;
   a tunnel barrier layer consisting of one or more metal oxide layers disposed over the magnetic reference layer;
   a magnetic storage layer formed from a $Co_xFe_yB_z$ alloy, where z is from about 10 wt. % to about 40 wt. %, y is from about 20 wt. % to about 60 wt. %, and x is equal to or less than 70 wt. %, the magnetic storage layer disposed over and in contact with the tunnel barrier layer, the magnetic storage layer comprising a first magnetic layer, a second magnetic layer, and a third layer, the third layer configured to strengthen a pinning moment;
   a capping layer disposed over the magnetic storage layer;
   a first protection layer disposed between the magnetic reference layer and the tunnel barrier layer, the first protection layer in contact with the magnetic reference layer and the tunnel barrier layer; and
   a second protection layer disposed between the magnetic storage layer and the capping layer, the second protection layer is continuous throughout an entirety of the second protection layer, the second protection layer in contact with the magnetic storage layer, wherein the second protection layer is a single layer, the first protection layer is a single layer, and wherein a material forming the first protection layer and the second protection layer differs from at least one of a material forming the magnetic reference layer and a material forming the magnetic storage layer, and wherein the first protection layer has a thickness between about 0.1 Å and about 3 Å, and the second protection layer has a thickness between about 0.1 Å and about 3 Å.

2. The film stack of claim 1, wherein the thickness of the first protection layer is less than a thickness of the magnetic reference layer.

3. The film stack of claim 1, wherein a material forming the first protection layer is one or more of magnesium and hafnium.

4. The film stack of claim 1, wherein each of the first protection layer and the second protection layer further comprises at least one of magnesium, hafnium, or an alloy thereof.

5. The film stack of claim 4, wherein the thickness of the second protection layer is less than a thickness of the magnetic storage layer.

6. The film stack of claim 4, wherein the material forming the second protection layer differs from the material forming the magnetic storage layer.

7. The film stack of claim 4, wherein the capping layer is comprised of a metal oxide.

8. The film stack of claim 1, further comprising:
   a structure blocking layer comprising Ta, molybdenum (Mo), tungsten (W), or combinations thereof, the structure blocking layer disposed below and in contact with the magnetic reference layer.

9. A method for forming a magnetic tunnel junction (MTJ) stack, the method comprising:
   depositing a magnetic reference layer formed from a $Co_xFe_yB_z$ alloy, where z is from about 10 wt. % to about 40 wt. %, y is from about 20 wt. % to about 60 wt. %, and x is equal to or less than 70 wt. %, the magnetic reference layer disposed over a substrate;
   depositing a tunnel barrier layer consisting of one or more metal oxide layers over the magnetic reference layer;
   depositing a magnetic storage layer formed from a $Co_xFe_yB_z$ alloy, where z is from about 10 wt. % to about 40 wt. %, y is from about 20 wt. % to about 60 wt. %, and x is equal to or less than 70 wt. %, the magnetic storage layer disposed over and in contact with the tunnel barrier layer, the magnetic storage layer comprising a first magnetic layer, a second magnetic layer, and a third layer, the third layer configured to strengthen a pinning moment;

depositing a capping layer over the magnetic storage layer; and depositing a first protection layer between the magnetic reference layer and the tunnel barrier layer, the first protection layer in contact with the magnetic reference layer and the tunnel barrier layer; and depositing a second protection layer disposed between the magnetic storage layer and the capping layer, the second protection layer is continuous throughout an entirety of the second protection layer, the second protection layer in contact with the magnetic storage layer, wherein the second protection layer is a single layer, the first protection layer is a single layer, and wherein a material forming the first protection layer and the second protection layer differs from at least one of the magnetic reference layer and the magnetic storage layer, and wherein the first protection layer has a thickness between about 0.1 Å and about 3 Å, and the second protection layer has a thickness between about 0.1 Å and about 3 Å.

10. The method of claim 9, wherein each of the first protection layer and the second protection layer further comprises at least one of magnesium, hafnium, or an alloy thereof.

11. The method of claim 10, wherein the thickness of the first protection layer is less than a thickness of the magnetic reference layer.

12. The method of claim 10, wherein the thickness of the second protection layer is less than a thickness of the magnetic storage layer.

13. The method of claim 10, wherein the material forming the second protection layer differs from the material forming the magnetic storage layer.

14. The method of claim 10, wherein the capping layer is comprised of a metal oxide.

15. The method of claim 9, wherein the material forming the first protection layer is one or more of magnesium and hafnium.

16. A film stack for a magnetic tunnel junction (MTJ), comprising:

a substrate;

a magnetic reference layer formed from a $Co_xFe_yB_z$ alloy, where z is from about 10 wt. % to about 40 wt. %, y is from about 20 wt. % to about 60 wt. %, and x is equal to or less than 70 wt. %, the magnetic reference layer disposed over the substrate;

a first protection layer is a single layer disposed over and in contact with the magnetic reference layer;

a tunnel barrier layer consisting of one or more metal oxide layers disposed over and in contact with the first protection layer;

a magnetic storage layer formed from a $Co_xFe_yB_z$ alloy, where z is from about 10 wt. % to about 40 wt. %, y is from about 20 wt. % to about 60 wt. %, and x is equal to or less than 70 wt. %, the magnetic storage layer disposed over and in contact with the tunnel barrier layer, the magnetic storage layer comprising a first magnetic layer, a second magnetic layer, and a third layer, the third layer configured to strengthen a pinning moment;

a second protection layer disposed over and in contact with the magnetic storage layer, wherein the second protection layer is a single layer, and wherein the second protection layer is continuous throughout an entirety of the second protection layer, wherein the first protection layer has a thickness between about 0.1 Å and about 3 Å, and the second protection layer has a thickness between about 0.1 Å and about 3 Å; wherein the first protection layer and the second protection layer are comprised of one or more of magnesium and hafnium; and a capping layer disposed over the second protection layer.

17. The film stack of claim 16, wherein the thickness of the first protection layer is less than a thickness of the magnetic reference layer, and the thickness of the second protection layer is less than a thickness of the magnetic storage layer.

18. The film stack of claim 16, wherein at least one of the tunnel barrier layer and the capping layer is comprised of a metal oxide.

* * * * *